US 6,711,664 B1

United States Patent
Gold et al.

(10) Patent No.: US 6,711,664 B1
(45) Date of Patent: Mar. 23, 2004

(54) METHOD AND SYSTEM FOR DECODING A ROW ADDRESS TO ASSERT MULTIPLE ADJACENT ROWS IN A MEMORY STRUCTURE

(75) Inventors: Spencer M. Gold, Pepperell, MA (US); Jason Eisenberg, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 101 days.

(21) Appl. No.: 09/660,721

(22) Filed: Sep. 13, 2000

(51) Int. Cl.[7] .......................... G06F 12/00; G11C 8/10; G11C 8/12
(52) U.S. Cl. .................. 711/217; 711/220; 365/230.06; 365/238.5
(58) Field of Search ................................ 711/105, 217, 711/220, 218, 219; 365/230.06, 238.5, 189.04

(56) References Cited

U.S. PATENT DOCUMENTS

| 4,593,383 | A | | 6/1986 | Armstrong et al. | .......... 365/203 |
| 4,597,063 | A | * | 6/1986 | Takemae | ............... 365/189.01 |
| 4,729,119 | A | * | 3/1988 | Dennison et al. | ...... 365/230.09 |
| 4,954,994 | A | * | 9/1990 | Hashimoto | ............. 365/230.06 |
| 4,965,770 | A | * | 10/1990 | Yanagisawa | ............. 365/238.5 |
| 5,235,545 | A | * | 8/1993 | McLaury | ............... 365/189.04 |
| 5,274,596 | A | | 12/1993 | Watanabe | .................... 365/203 |
| 5,289,429 | A | * | 2/1994 | Watanabe | ................... 365/230.06 |
| 5,339,277 | A | | 8/1994 | McClure | .............. 365/230.08 |
| 5,367,655 | A | * | 11/1994 | Grossman et al. | ..... 365/230.03 |
| 6,125,071 | A | | 9/2000 | Kohno et al. | .......... 365/230.03 |

FOREIGN PATENT DOCUMENTS

| EP | 549 218 | 6/1993 |
| JP | 11-306571 | 11/1999 |

* cited by examiner

*Primary Examiner*—Glenn Gossage
(74) *Attorney, Agent, or Firm*—Lahive & Cockfield, LLP

(57) ABSTRACT

A memory array or structure and method for decoding a read address to facilitate simultaneous reading of successive rows. The memory includes row decoders in the form of decoding logic for enabling multiple rows of the memory structure to be read in response to a single row address. The memory structure helps to reduce the number of ports that are required for the memory structure and, thus, reduces the die area occupied by the memory structure. The row address may be divided into most significant bits and least significant bits. Further, the decoding logic may decode the most significant bits differently from the least significant bits when processing the row address. The most significant bits may be preprocessed or predecoded into a fully decoded format while the least significant bits may be decoded into a priority decoded format.

11 Claims, 4 Drawing Sheets

| ROW | BINARY REPRESENTATION 30 | M 32<br>7      0 | L 34<br>7      0 |
|---|---|---|---|
| 0 | 0 0 0 0 0 0 | 0 0 0 0 0 0 0 1 | 0 0 0 0 0 0 0 0 |
| 1 | 0 0 0 0 0 1 | 0 0 0 0 0 0 0 1 | 0 0 0 0 0 0 0 1 |
| 2 | 0 0 0 0 1 0 | 0 0 0 0 0 0 0 1 | 0 0 0 0 0 0 1 1 |
| 3 | 0 0 0 0 1 1 | 0 0 0 0 0 0 0 1 | 0 0 0 0 0 1 1 1 |
| 4 | 0 0 0 1 0 0 | 0 0 0 0 0 0 0 1 | 0 0 0 0 1 1 1 1 |
| 5 | 0 0 0 1 0 1 | 0 0 0 0 0 0 0 1 | 0 0 0 1 1 1 1 1 |
| 6 | 0 0 0 1 1 0 | 0 0 0 0 0 0 0 1 | 0 0 1 1 1 1 1 1 |
| 7 | 0 0 0 1 1 1 | 0 0 0 0 0 0 0 1 | 0 1 1 1 1 1 1 1 |
| 8 | 0 0 1 0 0 0 | 0 0 0 0 0 0 1 0 | 0 0 0 0 0 0 0 0 |
| 9 | 0 0 1 0 0 1 | 0 0 0 0 0 0 1 0 | 0 0 0 0 0 0 0 1 |
| 10 | 0 0 1 0 1 0 | 0 0 0 0 0 0 1 0 | 0 0 0 0 0 0 1 1 |
| 11 | 0 0 1 0 1 1 | 0 0 0 0 0 0 1 0 | 0 0 0 0 0 1 1 1 |
| 12 | 0 0 1 1 0 0 | 0 0 0 0 0 0 1 0 | 0 0 0 0 1 1 1 1 |
| 13 | 0 0 1 1 0 1 | 0 0 0 0 0 0 1 0 | 0 0 0 1 1 1 1 1 |
| 14 | 0 0 1 1 1 0 | 0 0 0 0 0 0 1 0 | 0 0 1 1 1 1 1 1 |
| 15 | 0 0 1 1 1 1 | 0 0 0 0 0 0 1 0 | 0 1 1 1 1 1 1 1 |
| 16 | 0 1 0 0 0 0 | 0 0 0 0 0 1 0 0 | 0 0 0 0 0 0 0 0 |
| 17 | 0 1 0 0 0 1 | 0 0 0 0 0 1 0 0 | 0 0 0 0 0 0 0 1 |
| ⋮ | ⋮ | ⋮ | ⋮ |
| 62 | 1 1 1 1 1 0 | 1 0 0 0 0 0 0 0 | 0 0 1 1 1 1 1 1 |
| 63 | 1 1 1 1 1 1 | 1 0 0 0 0 0 0 0 | 0 1 1 1 1 1 1 1 |

*FIG. 3*

METHOD AND SYSTEM FOR DECODING A ROW ADDRESS TO ASSERT MULTIPLE ADJACENT ROWS IN A MEMORY STRUCTURE

TECHNICAL FIELD

The present invention relates generally to decoding of addresses and more particularly to method and system for decoding a row address to assert multiple adjacent rows in a memory structure.

BACKGROUND OF THE INVENTION

Superscalar microprocessors may seek to simultaneously execute multiple instructions. Such microprocessors include memory arrays (such as instruction caches) that enable multiple instructions to be simultaneously fetched (i.e. read from the memory array) and fed into an execution unit or pipeline. With such microprocessors, instructions that are to be fetched together may be stored in adjacent rows of the memory array. Thus, the memory array must support the simultaneous reading of the adjacent rows.

Conventional superscalar microprocessors have provided additional ports in the memory arrays to facilitate simultaneous retrieval of adjacent rows. For example, if a microprocessor supports the simultaneous reading of eight instructions from the memory array, the memory array includes eight ports to receive the corresponding row addresses. Unfortunately, the use of such a large number of ports (e.g. eight ports) may waste die area on the microprocessor, as the ports occupy a fairly large amount of space on the microprocessor.

SUMMARY OF THE INVENTION

The present invention addresses the above-described limitation by providing an approach that enables a single row address for a memory structure to be decoded so that multiple rows in the memory structure may be asserted so as to be simultaneously read. This approach decreases the number of ports required for the memory structure. In some cases, only a single port may be required. For example, eight rows of a memory array may be simultaneously read in response to a single row address in an embodiment of the present invention. The present invention may provide decoding logic that automatically causes the rows logically adjacent to an addressed row (i.e., the row identified by the row address) to be asserted in response to a single row address. Hence, each row has a decoder that asserts the row in response to a range of row addresses.

In accordance with one aspect of the present invention, a memory array includes rows of storage cells and a single access port. The memory array also includes decoding logic for asserting a read signal for simultaneously reading a selected one of the rows and a predetermined number of the rows that are adjacent to the selected one of the rows in response to a read request received at the access port. An identifier of the selected row is provided by the read request. This memory array may be found within a microprocessor and separate decoders may be provided for the respective rows.

In accordance with another aspect of the present invention, a row address decoder is provided for decoding a received row address. A selected row is associated with the decoder and is part of a memory array that has rows addressed in sequence. The decoder includes a first component and a second component. The first component asserts the selected row if an integer portion of a result of dividing the selected row address by a number of rows to be simultaneously asserted is equal to an integer portion of a result of dividing the received row address by the number of rows to be simultaneously asserted and if the row address of the selected row follows or is equal to the received row address in the sequence. The second component asserts the selected row if an integer portion of the row address of the selected row divided by the number of rows to be simultaneously asserted exceeds by one an integer portion of the received row address divided by the number of rows to be simultaneously asserted and if the row address of the selected row minus the received row address does not exceed the number of rows to be simultaneously asserted minus one. The components may include logic gates and the like.

In accordance with a further aspect of the present invention, a method of decoding a read address having most significant bits and least significant bits to facilitate simultaneous reading of successive rows in a storage device is practiced. In accordance with this method, the most significant bits of the read address are converted into a fully decoded format to produce a fully decoded vector. The least significant bits of the read address are converted into a priority decoded format to produce a priority decoded vector. For each row in the storage device, logical operations are performed on at least one bit in the fully decoded vector and at least one bit in the priority decoded vector to determine whether to read the row.

BRIEF DESCRIPTION OF THE DRAWINGS

An illustrative embodiment of the present invention will be described below relative to the following drawings.

FIG. 3 depicts a binary representation of a row address along with a decoding of the most significant bits and a decoding of the least significant bits of the binary representation.

DETAILED DESCRIPTION OF THE INVENTION

The illustrative embodiment of the present invention provides a memory structure, such as a memory array, that may employ a reduced number of ports while still supporting the simultaneous reading of multiple logically adjacent rows of the memory structure. The memory structure employs unique decoding logic to facilitate the simultaneous reading of rows that are adjacent to an addressed row in the memory structure. The memory structure is particularly well suited for use in a superscalar microprocessor that requires support for simultaneous execution of instructions. The reduced number of ports conserves precious space in the microprocessor.

Figure 1:
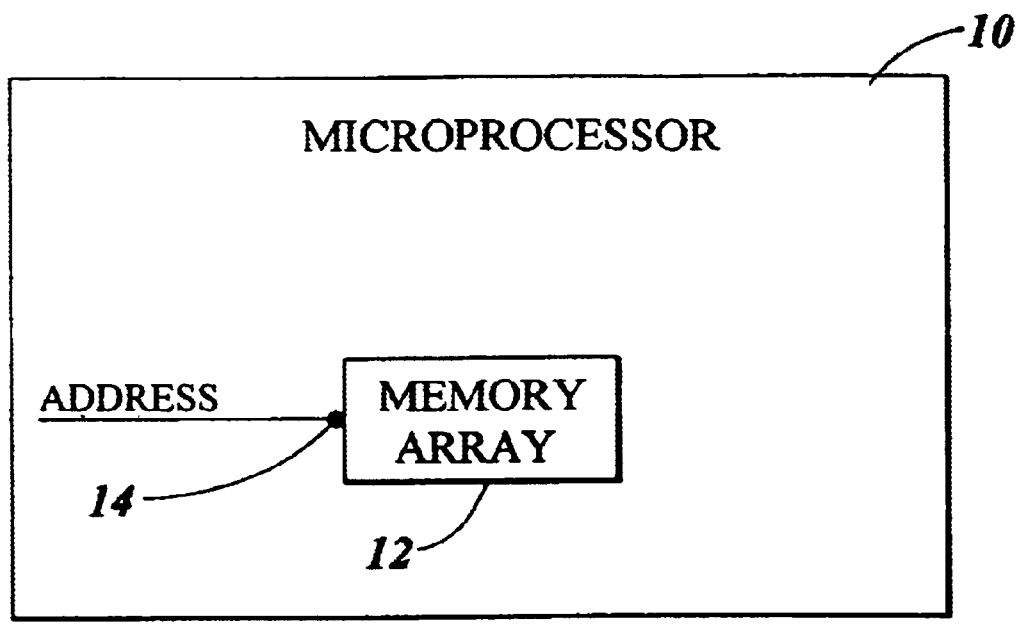
FIG. 1 is a block diagram illustrating a microprocessor and memory array that are suitable for practicing the illustrative embodiment of the present invention.

FIG. 1 depicts an environment that is suitable for practicing the illustrative embodiment of the present invention. In the environment depicted in FIG. 1, a microprocessor 10 includes a memory array 12. The microprocessor 10 may be a reduced instruction set computer (RISC) processor that is compatible with the SPARC™ standard developed by SPARC™ International, Inc. The memory array 12 includes a single read address port 14. A read address for a row of the memory array is applied to the read address port 14 to cause multiple rows of the memory to be read. The memory array 12 may be, for example, an instruction cache holding instructions on respective rows that are separately addressable. The microprocessor may need to simultaneously read multiple instructions and, hence, multiple rows from the memory array.

Those skilled in the art will appreciate that the present invention does not require that the memory array 12 be present within a microprocessor 10. In alternative embodiments, the memory array may be part of another type of device, such as a controller or a stand alone memory structure. In addition, those skilled in the art will appreciate that the present invention does not require the memory structure be a memory array per se but rather be a memory structure that has multiple locations that need to be simultaneously retrieved in response to a single location address. Those skilled in the art will appreciate that the microprocessor 10 may take many forms and may be compatible with different standards.

Figure 2:
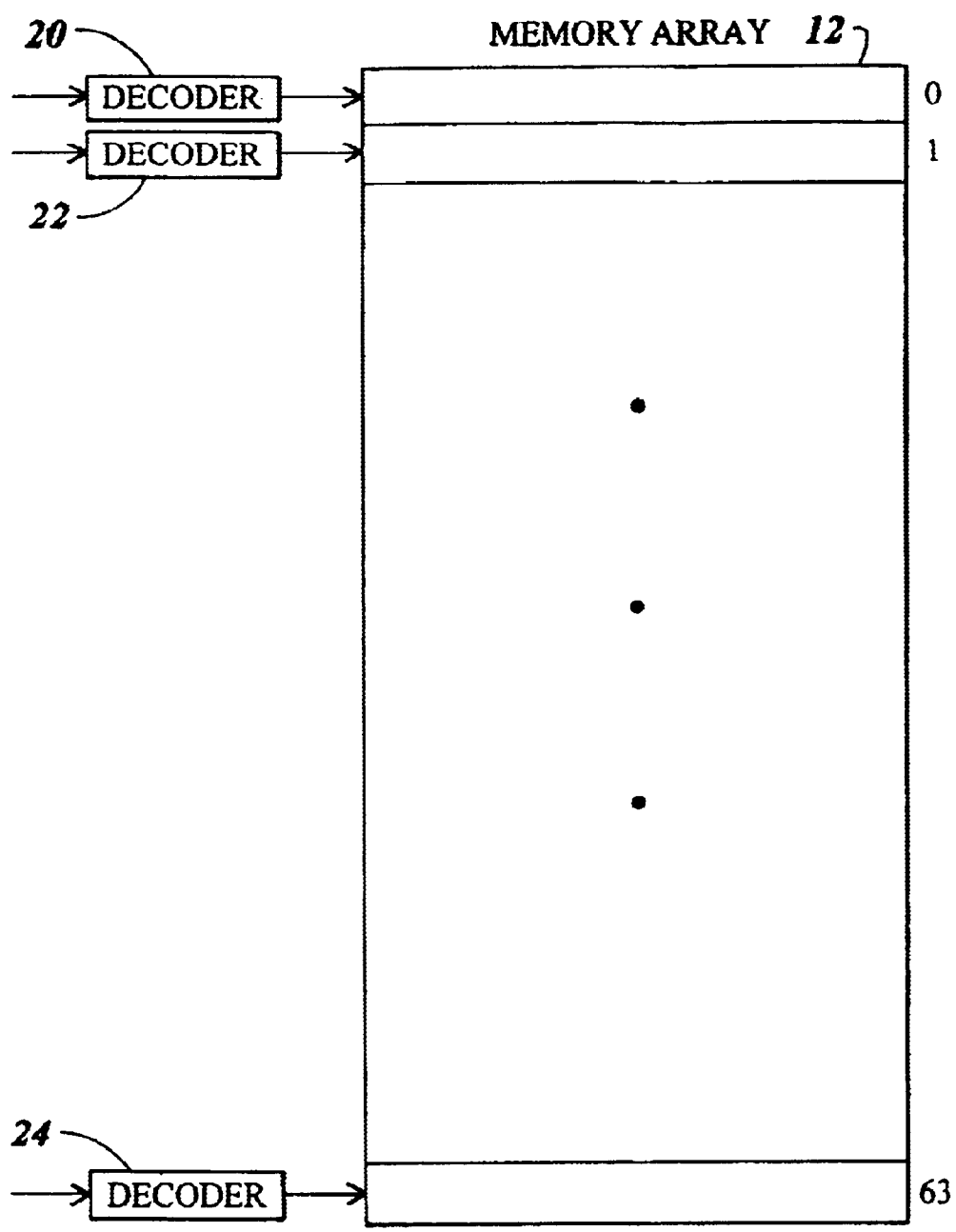
FIG. 2 is a logical depiction of the memory array 12 in FIG. 1.

FIG. 2 shows a logical depiction of the memory array 12. The memory array 12 is organized into rows. The length of the rows may vary but for illustrative purposes it may be assumed that each row is 64 bits wide. The rows are addressed in a sequence that is incremented by one between adjacent rows. The sequential addressing is not a requisite of the present invention. The memory array 12 depicted in FIG. 2 has sixty four rows numbered from 0–63. Those skilled in the art will appreciate that the memory array may have a different number of rows and that the depiction of sixty four rows is intended to be merely illustrative and not limiting of the present invention. Each row has a decoder for decoding a row address that is coupled to the read access port of the memory array 12 to receive a row address for decoding. For example, as shown in FIG. 2, row 0 has decoder 20, row 1 has decoder 22 and row 63 has decoder 24. These decoders 20, 22 and 24 decode the row address that is supplied from the read access port to determine whether the associated row should be read or not (i.e. asserted or not).

In the illustrative embodiment, the row address is specified in a binary format. FIG. 3 shows a table 30 of row addresses for the respective rows. In order to simultaneously assert multiple adjacent rows, the illustrative embodiment splits the binary representation of the row address into a most significant bits (MSB) decoded portion and a least significant bits (LSB) decoded portion. The number of most significant bits and least significant bits depends upon the number of rows that are to be simultaneously read. The variable "i" is used herein to designate the number of rows that are to be simultaneously read. The variable "n" designates the number of rows in the memory array. There are $(\log_2 n - \log_2 i)$ most significant bits, and there are $\log_2 i$ least significant bits. Note that it is presumed that n and i are powers of two. Those skilled in the art will appreciate, however, that the present invention does not require that n and i be powers of two.

In the example depicted in FIG. 3, each row address has six bits to represent the 64 (i.e., $2^6$) possible row designations. The example in FIG. 3 presumes that eight rows are to be simultaneously read. Hence, there are $((\log_2 64 - \log_2 8)$ or $(6-3)=3)$ most significant bits, and, therefore, there are three (i.e., $\log_2 8 = 3$) least significant bits.

The most significant bits (MSB's) are decoded differently from the least significant bits. The most significant bits are decoded into a fully decoded format. The fully decoded format represents a value x by placing a one in a bit position x in the fully decoded vector. For instance, zero is represented by placing a one at position zero in the vector, and one is represented by placing a one in the first bit position. In both cases, the other bit positions are set at zero. For the example case wherein the three most significant bits are to be decoded into a fully decoded format, eight bits are required in the fully decoded representation or vector. The table below sets forth the decoding.

| Fully Decoded Representation | MSB's |
|---|---|
| 00000001 | 000 |
| 00000010 | 001 |
| 00000100 | 010 |
| 00001000 | 011 |
| 00010000 | 100 |
| 00100000 | 101 |
| 01000000 | 110 |
| 10000000 | 111 |

FIG. 3 shows a table 30 of the binary representations of the 64 row addresses of the memory array. Table 32 contains a table of the M( ) vector values where each M( ) vector is the fully decoded vector for the most significant bits for the associated binary representation of the row address. The bits in the M( ) vector are indexed from 0 to 7 (i.e., a right to left order).

The least significant bits (LSB's) are decoded in a priority decoded format such that the total number of ones in the decoded vector corresponds to the value that is to be decoded. For the example case, the priority decoded representation and the associated least significant bits are as follows:

| Priority Decoded Representation | LSB's |
|---|---|
| 00000000 | 000 |
| 00000001 | 001 |
| 00000011 | 010 |
| 00000111 | 011 |
| 00001111 | 100 |
| 00011111 | 101 |
| 00111111 | 110 |
| 01111111 | 111 |

Table 34 in FIG. 3 depicts priority decoded representations of the least significant bits for the associated binary representations of the row addresses. The priority decoded representation is the L( ) vector having eight bits that are indexed from 0 to 7 (from right to left). The most significant bit M(7) is always 0 and, therefore, does not need to be calculated or stored.

Figure 4:
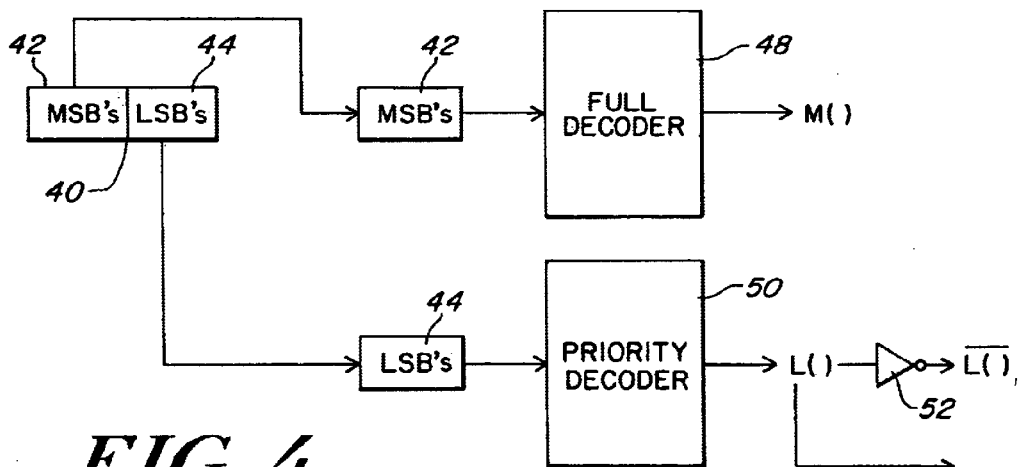
FIG. 4 is a block diagram illustrating the preprocessing of a row address in the illustrative embodiment.

FIG. 4 depicts representation of the preprocessing of the row address that is performed to generate the M( ) and L( ) vectors, such as shown in FIG. 3. The row address 40 is divided into MSB's 42 and LSB's 44. The MSB's 42 are sent to a full decoder 48 to produce the fully decoded M( ) vector. The LSB's 44 are sent to a priority decoder 50 which produces the L( ) vector. The complement of the L( ) vector (i.e., $\overline{L()}$) is produced by passing the L( ) vector through an inverter 52.

Figure 5A:
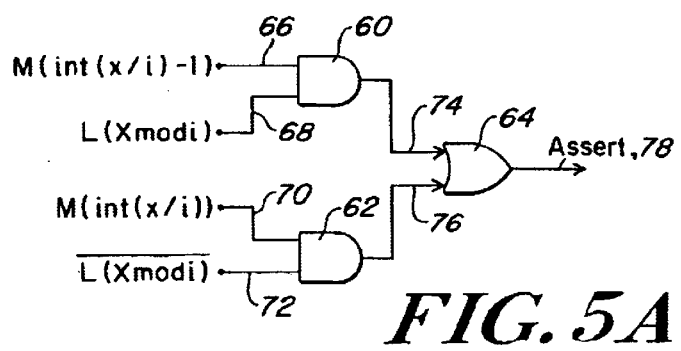
FIG. 5A shows a logic diagram of the logic that is applied in decoding a row address for rows 8–63 in an example in accordance with the illustrative embodiment of the present invention.

Selected bits from the M( ), the L( ) vector and the complement of the L( ) vector (i.e., $\overline{L()}$) are input to respective row decoders to determine whether to assert the row associated with the respective decoders in response to the row address. FIG. 5A depicts the logical format of the decoder for rows 8 through 63 in the example case. Those skilled in the art will appreciate that additional alternative logical configurations may be utilized to practice the present invention and that the use of the AND gates and the OR gate in FIG. 5A is intended to be merely illustrative and not limiting of the present invention. The bit at location M(int (x/i)−1) is fed into the first input 66 of AND gate 60 (where x is the received row address and i is the number of rows to be simultaneously read). The into function refers to a function that grabs the integer portion of the value specified as an input to the function. Hence, int(x/i) refers to the integer portion of x/i. The second input 68 of AND gate 60 is tied to the (x mod i) bit in the L vector.

An example is helpful to illustrate the operation of the decoder and logic gates shown in FIG. 5A. The decoder for a specific row will have a logically high output if the incoming row address specifies a row that falls within the grouping of i that begins i−1 rows before that row and ends with the row itself. For example, row 10 will be asserted if the incoming row address is in the range of 3 through 10. Since row 10 is in the second group of eight rows (i.e., rows 8–15), there are two cases that will assert the row 10 decoder. The first occurs when the incoming row address specifies a row within the first three entries of the second group of eight rows (i.e., rows 8–10). The AND gate 62 detects this case. The second occurs when the incoming row address specifies a row within the last five entries of the first group of eight rows (i.e., rows 3–7). The AND gate 60 detects this case.

To detect the first case, input 70 of the AND gate 62 is connected to M((int)xi) while input 72 is connected to the complement of L(x mod i). In this example, x=10 and i=8, meaning that int(x/i)=1 while x mod i=2. Therefore, input 70 is connected to M(1) and input 72 is connected to the complement of L(2). By doing so, the AND gate 62 will be asserted high if the incoming address specifies one of the first three rows of the second group of eight rows (i.e., rows 8–10).

The output of the AND gate 62 is fed into input 76 or an OR gate 64. The output 78 of the OR gate 64 will be logically high (i.e., one) if the output of either the AND gate 62 or the AND gate 60 is high. The output of the AND gate 62 is high when inputs 70 and 72 are high.

To detect the second case, input 66 of the AND gate 60 is connected to M(int(x/i)−1) while input 68 is connected to L(x mod i). In this example, x/i−1=0 and x mod i=2. Therefore, input 66 is connected to M(0) and input 68 is connected to L(2). By connecting input 66 to M(0) and input 68 to L(2), the AND gate 60 will be asserted high if the incoming address specifies one of the last five rows of the first group of eight rows (i.e., rows 3–7).

Figure 5B:
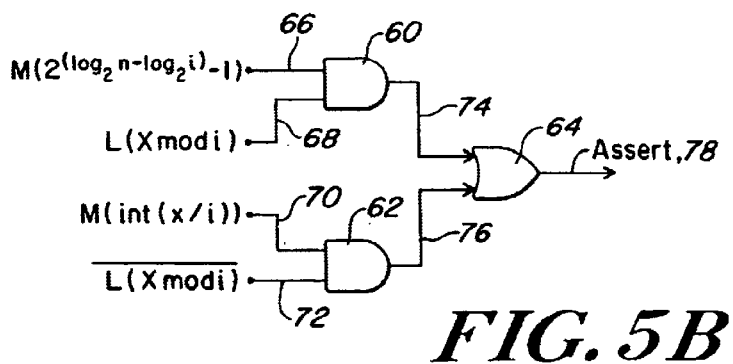
FIG. 5B shows a logic diagram of the logic that is applied in decoding a row address for rows 0–7 in an example in accordance with the illustrative embodiment of the present invention.

As shown in FIG. 5B, there is a slight modification for the decoders for rows 0 through 7 in the example described herein. Specifically, the input 66 is specified as M($2^{(\log_2 n - \log_2 i)} - 1$). For this example, the input 66 would be connected to M(7). This change facilitates the wrap around that is necessary for the memory array to operate properly. Hence, row 0 may be asserted for incoming row addresses 57–63 as well as address 0.

While the present invention has been described with reference to an illustrative embodiment thereof, those skilled in the art will appreciate that various changes in form and detail may be made without departing from the intended scope of the present invention as defined in the appended claims.

What is claimed is:

1. A memory array, comprising:

rows of storage cells;

a single access port; and decoding logic for asserting simultaneously a selected one of the rows and a predetermined number of the rows that are logically adjacent to the selected one of the rows in response to a read request received at the access port, wherein an identifier of the selected one of the rows is provided by the request, wherein the identifier is divided into most significant bits and least significant bits, the most significant bits are processed into a fully decoded format, and the least significant bits are decoded into a priority decoded format.

2. A memory array, comprising:

rows of storage cells;

a single access port; and decoding logic for asserting simultaneously a selected one of the rows and a predetermined number of the rows that are logically adjacent to the selected one of the rows in response to a read request received at the access port, wherein an identifier of the selected one of the rows is provided by the request, wherein the identifier is divided into most significant bits and least significant bits, and the least significant bits are decoded into a priority decoded format.

3. A row address decoder for decoding a received row address, wherein a selected row is associated with the decoder and is part of a memory array having rows that are addressed in a sequence, said row address decoder comprising:

a first component for asserting the selected row if an integer portion of a result of dividing the received row address by a number of rows to be simultaneously asserted is equal to an integer portion of a result of dividing a row address for the selected row by the number of rows to be simultaneously asserted and the row address of the selected row follows the received row address in the sequence; and a second component for asserting the selected row if an integer portion of a result of dividing the row address of the selected row by the number of rows to be simultaneously asserted exceeds by one an integer portion of the received row address divided by the number of rows to be simultaneously asserted and the row address of the selected row minus the received row address does not exceed the number of rows to be simultaneously asserted minus one.

4. The decoder of claim 3, wherein the second component includes a gate for logically ANDing a bit from a decoding of most significant bits of the received row address with a bit from a decoding of least significant bits of the received row address.

5. The decoder of claim 4, wherein the encoding of the most significant bits is a fully decoded format of the ($\log_2 n - \log_2 i$) most significant bits, where n is a number of rows in the memory array and i is a number of rows to be simultaneously asserted.

6. The decoder of claim 3, wherein the first component includes a gate for logically ANDing a bit from an encoding of most significant bits of the received row address with a bit from an encoding of least significant bits of the received row address.

7. The decoder of claim 6, wherein the encoding of the most significant bits is a fully decoded format of the ($\log_2 n - \log_2 i$) most significant bits, where n is a number of rows in the memory array and i is a number of rows to be simultaneously asserted.

8. The decoder of claim 7, wherein the gate logically AND's a bit z of the decoding of the most significant bits of the received row address with a bit y of a complement of the decoding of the least significant bits, wherein z equals an integer portion of (the row address of the selected row divided by the number of rows to be simultaneously asserted) and y equals (the row address of the selected row) mod (the number of rows to be simultaneously asserted).

9. The decoder of claim 7, wherein the gate logically AND's a bit q of the decoding of the most significant bits of the received row address with a bit r of the decoding of the least significant bits of the received row address, wherein q equals (an integer portion of (the row address of the selected row divided by the number of rows to be simultaneously asserted) minus 1), and r equals (the row address of the selected row) mod (the number of rows to be simultaneously asserted).

10. In a storage device having addressable rows, a method of decoding a read address having most significant bits and least significant bits to facilitate simultaneous reading of successive rows, comprising the steps of:

converting the most significant bits of the read address into a fully decoded format to produce a fully decoded vector;

converting the least significant bits of the read address into a priority decoded format to produce a priority decoded vector; and for each row, performing logical operations on at least one bit in the fully decoded vector and at least one bit in the priority decoded vector to determine whether to read that row.

11. The method of claim 10, wherein the logical operations are performed to determine if a row is within a specified address range relative to the read address.

* * * * *